United States Patent
Hayakawa

(10) Patent No.: US 8,891,159 B2
(45) Date of Patent: Nov. 18, 2014

(54) OPTICAL SEMICONDUCTOR ELEMENT, SEMICONDUCTOR LASER, AND METHOD OF MANUFACTURING OPTICAL SEMICONDUCTOR ELEMENT

(75) Inventor: Akinori Hayakawa, Sagamihara (JP)

(73) Assignee: Fujitsu Limited, Kawasaki (JP)

( * ) Notice: Subject to any disclaimer, the term of this patent is extended or adjusted under 35 U.S.C. 154(b) by 232 days.

(21) Appl. No.: 13/416,075

(22) Filed: Mar. 9, 2012

(65) Prior Publication Data

US 2012/0236394 A1    Sep. 20, 2012

(30) Foreign Application Priority Data

Mar. 16, 2011    (JP) .................. 2011-058018

(51) Int. Cl.
| | | |
|---|---|---|
| *H01S 5/343* | (2006.01) | |
| *G02B 5/18* | (2006.01) | |
| *H01S 5/227* | (2006.01) | |
| *H01S 5/12* | (2006.01) | |
| *H01L 21/02* | (2006.01) | |
| *H01S 5/20* | (2006.01) | |
| *H01S 5/00* | (2006.01) | |
| *H01S 5/34* | (2006.01) | |

(52) U.S. Cl.
CPC ......... *H01L 21/02463* (2013.01); *H01S 5/0092* (2013.01); *H01S 5/2275* (2013.01); *H01S 5/12* (2013.01); *H01L 21/02579* (2013.01); *H01L 21/02576* (2013.01); *H01S 5/3412* (2013.01); *H01S 5/209* (2013.01); *H01L 21/02546* (2013.01); *H01L 21/0262* (2013.01)
USPC ........ 359/328; 359/574; 359/576; 372/50.11; 385/37; 257/E21.09

(58) Field of Classification Search
USPC ................. 359/328, 566, 569, 573–574, 576; 372/43.01, 50.11; 385/37; 438/32; 257/E21.09
See application file for complete search history.

(56) References Cited

U.S. PATENT DOCUMENTS 6,763,165 B1 *   7/2004   Wesstrom et al. .............. 385/37
7,769,065 B2 *   8/2010   Hashimoto ................. 372/43.01
(Continued)

FOREIGN PATENT DOCUMENTS

| JP | 08-316566 | 11/1996 |
|---|---|---|
| JP | 09-121075 | 5/1997 |

(Continued)

OTHER PUBLICATIONS

Japanese Office Action dated Jun. 3, 2014, in the corresponding Japanese patent application No. 2011-058018, with a partial English translation.

*Primary Examiner* — Daniel Petkovsek
(74) *Attorney, Agent, or Firm* — Kratz, Quintos & Hanson, LLP

(57) ABSTRACT

An optical semiconductor element includes: a grating base layer including a projection-recess structure disposed over a substrate; and a grating cover layer including a group III-V semiconductor having three or more elements, wherein the grating cover layer includes a first region which is disposed over recessed portions of the grating base layer and which has a compositional ratio of a group III-V semiconductor having a first refractive index, and a second region which is disposed over projecting portions of the grating base layer and which has a compositional ratio of a group III-V semiconductor having a second refractive index that is smaller than the first refractive index, wherein the grating base layer includes a group III-V semiconductor having a third refractive index that is smaller than the first refractive index.

8 Claims, 15 Drawing Sheets

(56) References Cited

U.S. PATENT DOCUMENTS

| | | |
|---|---|---|
| 7,781,796 B2 | 8/2010 | Masui |
| 2003/0043878 A1 | 3/2003 | Funabashi et al. |
| 2006/0146902 A1 | 7/2006 | Ikoma et al. |
| 2008/0002748 A1 | 1/2008 | Masui |
| 2008/0165818 A1* | 7/2008 | Hashimoto ................ 372/43.01 |
| 2011/0229079 A1* | 9/2011 | Matsumoto .................... 385/37 |

FOREIGN PATENT DOCUMENTS

| | | |
|---|---|---|
| JP | 2003-060295 | 2/2003 |
| JP | 2003-133636 | 5/2003 |
| JP | 2006-147797 | 6/2006 |
| JP | 2008-28374 A1 | 2/2008 |
| JP | 2011-029426 | 2/2011 |

* cited by examiner

OPTICAL SEMICONDUCTOR ELEMENT, SEMICONDUCTOR LASER, AND METHOD OF MANUFACTURING OPTICAL SEMICONDUCTOR ELEMENT

CROSS-REFERENCE TO RELATED APPLICATIONS

This application claims the benefit of priority from Japanese Patent Application No. 2011-058018 filed on Mar. 16, 2011, the entire contents of which are incorporated herein by reference.

FIELD

The embodiments discussed herein are related to an optical semiconductor element including a grating layer, a semiconductor laser including the optical semiconductor element, and a method of manufacturing the optical semiconductor element.

BACKGROUND

Semiconductor lasers may be used in the fields of optical communication, laser printers, optical pickups for information recording disks, and the like. A semiconductor laser has a layered structure including an active layer having a predetermined bandgap. A laser beam is oscillated by utilizing recombination light emission of carriers injected into the active layer and optical resonance using cleaved end faces, a diffraction grating, or the like.

Related art is disclosed, for example, in Japanese Laid-open Patent Publication No. 2008-028374.

SUMMARY

According to one aspect of the embodiments, an optical semiconductor element includes: a grating base layer including a projection-recess structure disposed over a substrate; and a grating cover layer including a group III-V semiconductor having three or more elements, wherein the grating cover layer includes a first region which is disposed over recessed portions of the grating base layer and which has a compositional ratio of a group III-V semiconductor having a first refractive index, and a second region which is disposed over projecting portions of the grating base layer and which has a compositional ratio of a group III-V semiconductor having a second refractive index that is smaller than the first refractive index, wherein the grating base layer includes a group III-V semiconductor having a third refractive index that is smaller than the first refractive index.

Additional advantages and novel features of the invention will be set forth in part in the description that follows, and in part will become more apparent to those skilled in the art upon examination of the following or upon learning by practice of the invention.

DESCRIPTION OF EMBODIMENTS

A green laser operating in a wavelength range around 530 nm is used as a microprojector or high-luminosity laser pointer. A second harmonic generation (SHG) element included in a 530-nm range green laser halves the wavelength of a 1,060-nm range infrared laser. The 1,060-nm range infrared laser may oscillate in a single longitudinal mode.

Examples of a semiconductor laser that oscillates in a single longitudinal mode include a distributed feedback (DFB) semiconductor laser and a distributed Bragg reflector (DBR) semiconductor laser, in which a diffraction grating is provided in the vicinity of the active layer. The diffraction grating has a periodic recess-projection structure including materials having different refractive indices. Among the light emissions of the active layer, light having wavelengths near the Bragg wavelength, which is determined by the projection-recess period of the diffraction grating and the equivalent refractive index, is resonated by the diffraction grating.

In a semiconductor laser having a diffraction grating, the laser beam output efficiency, the oscillation wavelength temperature characteristics, and the like may be determined by the product $\kappa L$ of the coupling coefficient $\kappa$ of the diffraction grating and the resonator length L. The coupling coefficient $\kappa$ of the diffraction grating indicates the optical distributed feedback ratio and is determined by the difference in the refractive index between the projecting portions and the recessed portions of the diffraction grating, the grating depth, or the like. The product $\kappa L$ may be about 1. When reducing the size of DFB or DBR semiconductor lasers having a resonator with a short length L, the coupling coefficient $\kappa$ of the diffraction grating and, for example, the difference in the refractive index of the diffraction grating may be increased.

Figure 1A:
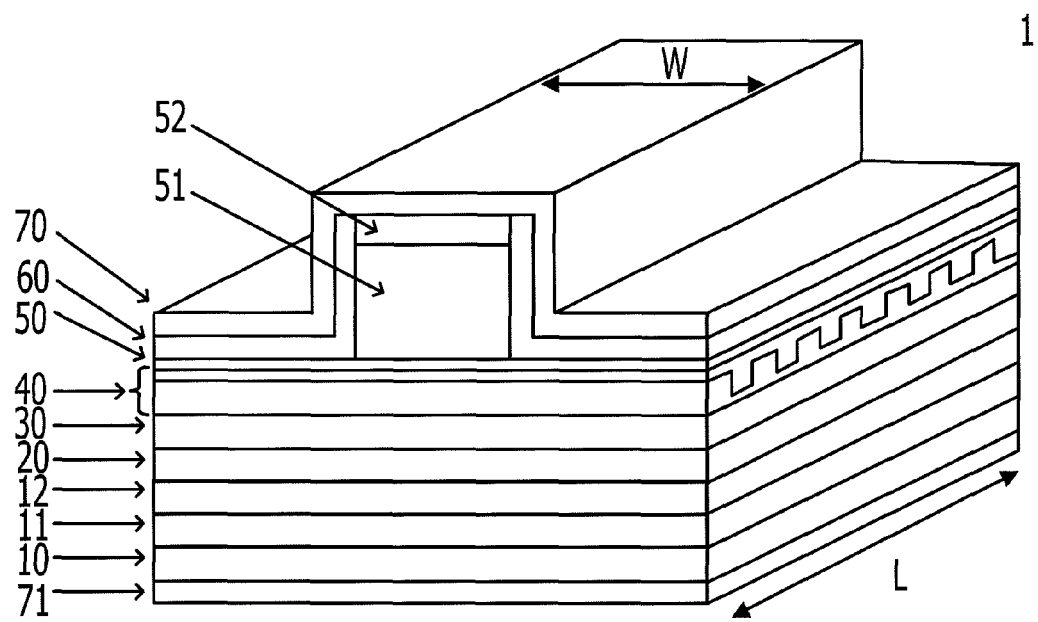
FIGS. 1A and 1B illustrate an exemplary distributed feedback (DFB) semiconductor laser.
Figure 1B:
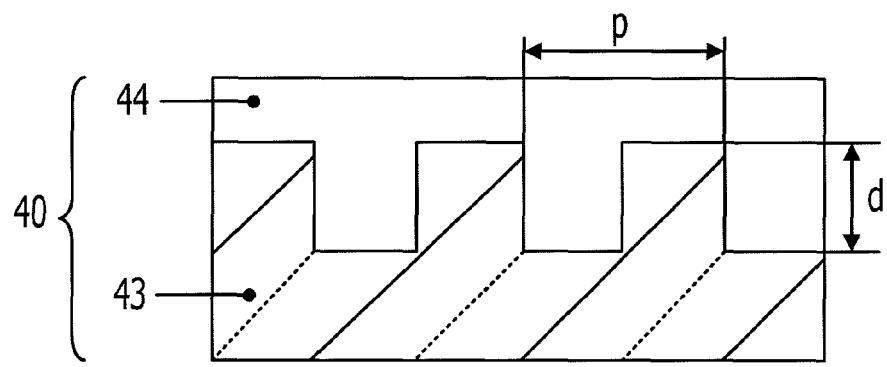

FIGS. 1A and 1B illustrate an exemplary distributed feedback semiconductor laser. FIG. 1A is a perspective view of a DFB laser element. In a DFB laser element 1, a cladding layer 12 of a first conductivity type, an active layer 20, a grating layer 40 of a second conductivity type including a base layer and a cover layer, a cladding layer 51 and a contact layer 52 having a ridge structure, an upper electrode 70, a lower electrode 71, and the like are stacked on a substrate 10. A buffer layer 11 of the first conductivity type, which may be a layer underlying the cladding layer 12 of the first conductivity type, accommodates the growth face. A cladding layer 30 of the second conductivity type confines light and carriers to the active layer 20. A silicon oxide film 60 delimits an electrode contact region. The silicon oxide film 60 may be a protective film. The projection-recess period and equivalent refractive index of the grating layer 40 are set so as to obtain the desired Bragg wavelength. Injection of a current via the electrodes 70 and 71 causes light emission in the active layer 20 and resonance in the grating layer 40, and as a result, a laser beam of a single longitudinal mode is emitted from the end face. Since the cladding layer 51 and the contact layer 52 have a ridge structure with a predetermined width W, a laser beam with a transverse fundamental mode is emitted owing to a current narrowing effect. The characteristics of the DFB laser element may be mainly determined by the product $\kappa L$ of the coupling coefficient $\kappa$ of the grating layer 40 and the resonator length L.

FIG. 1B is an enlarged cross-sectional view of a grating layer of a DFB laser element. A grating layer 40 has a diffraction grating including a base layer 43 having a periodic projection-recess structure on the surface thereof and a cover layer 44 having a recess-projection structure that fills the projection-recess structure of the base layer 43. The grating layer 40 has a grating period p and a grating depth d. The coupling coefficient κ of the grating layer 40 may be proportional to the grating depth d and the difference in the refractive index between the base layer 43 and the cover layer 44. For example, the base layer 43 and the cover layer 44 may include AlGaAs (aluminum gallium arsenide). The refractive index of AlGaAs has a negative correlation with the compositional ratio of Al. Since the base layer 43 and the cover layer 44 include AlGaAs with different Al compositional ratios, the difference in refractive index in the grating layer 40, for example, the coupling coefficient κ of the grating layer 40, may be changed.

As a reference sample, a DFB laser element including a base layer composed of GaAs (gallium arsenide) and a cover layer composed of $Al_{0.26}Ga_{0.74}As$ is fabricated. The oscillation wavelength of the reference sample may be about 1,064 nm.

Figure 2A:
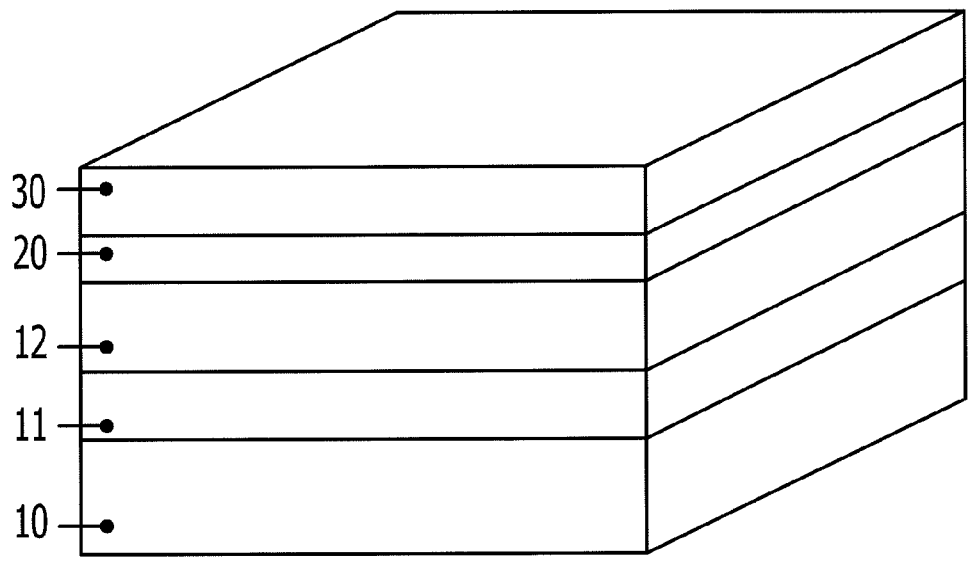
FIGS. 2A to 2I illustrate an exemplary method of fabricating a DFB laser element.
Figure 2B:
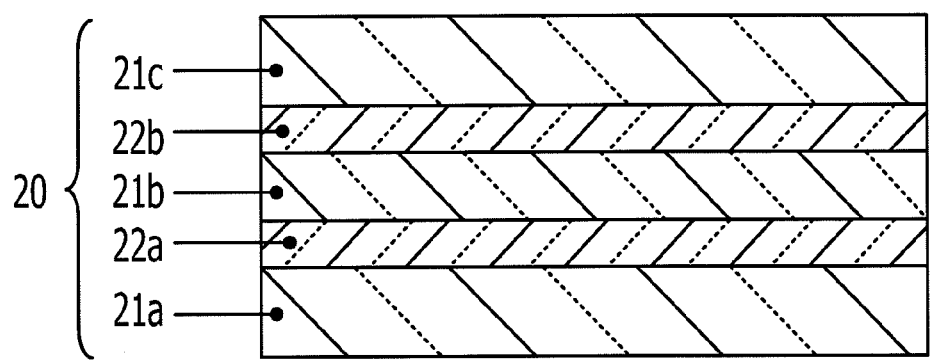

FIGS. 2A to 2I illustrate an exemplary method of fabricating a DFB laser element. As illustrated in FIGS. 2A and 2B, a buffer layer 11, a first cladding layer 12 of a first conductivity type, an active layer 20, and a second cladding layer 30 of a second conductivity type are stacked in that order on a substrate 10.

An n-type GaAs buffer layer 11 is epitaxially grown on an n-type GaAs. The n-type GaAs buffer layer 11 with a thickness of about 300 nm is formed by metal organic chemical vapor deposition (MOCVD). Triethylgallium (TEGa) and arsine ($AsH_3$) are used as source gases, and monosilane ($SiH_4$) is used as an n-type impurity gas. The growth temperature is set at about 600° C. An n-type $Al_{0.30}Ga_{0.70}As$ cladding layer 12 is epitaxially grown on the n-type GaAs buffer layer 11. The n-type $Al_{0.30}Ga_{0.70}As$ cladding layer 12 with a thickness of about 2,000 nm is formed by MOCVD. TEGa, trimethylaluminum (TMAl), and $AsH_3$ are used as source gases, and $SiH_4$ is used as an n-type impurity gas. The growth temperature is set at about 600° C. An active layer 20 is formed on the n-type $Al_{0.30}Ga_{0.70}As$ cladding layer 12.

FIG. 2B is an enlarged cross-sectional view of the active layer 20 illustrated in FIG. 2A. The active layer 20 may have a multiquantum well (MQW) structure including non-doped GaAs barrier layers 21a to 21c, and non-doped $In_{0.26}Ga_{0.74}As$ (indium gallium arsenide) well layers 22a and 22b. The barrier layer 21a with a thickness of about 40 nm, the well layer 22a with a thickness of about 6.5 nm, the barrier layer 21b with a thickness of about 20 nm, the well layer 22b with a thickness of about 6.5 nm, and the barrier layer 21c with a thickness of about 40 nm are formed by MOCVD. In forming the barrier layers 21a to 21c, TEGa and $AsH_3$ are used as source gases, and the growth temperature is set at about 640° C. In forming the well layers 22a and 22b, TEGa, trimethylindium (TMIn), and $AsH_3$ are used as source gases, and the growth temperature is set at about 640° C. The active layer may have a single heterostructure, a double heterostructure, a single quantum well structure, or an MQW structure including three or more layers.

As illustrated in FIG. 2A, a p-type $Al_{0.26}Ga_{0.74}As$ cladding layer 30 is epitaxially grown on the active layer 20. The p-type $Al_{0.26}Ga_{0.74}As$ cladding layer 30 with a thickness of about 150 nm is formed by MOCVD. TEGa, TMAl, and $AsH_3$ are used as source gases, and diethyl zinc (DEZn) is used as a p-type impurity gas. The growth temperature is set at 640° C.

Figure 2C:
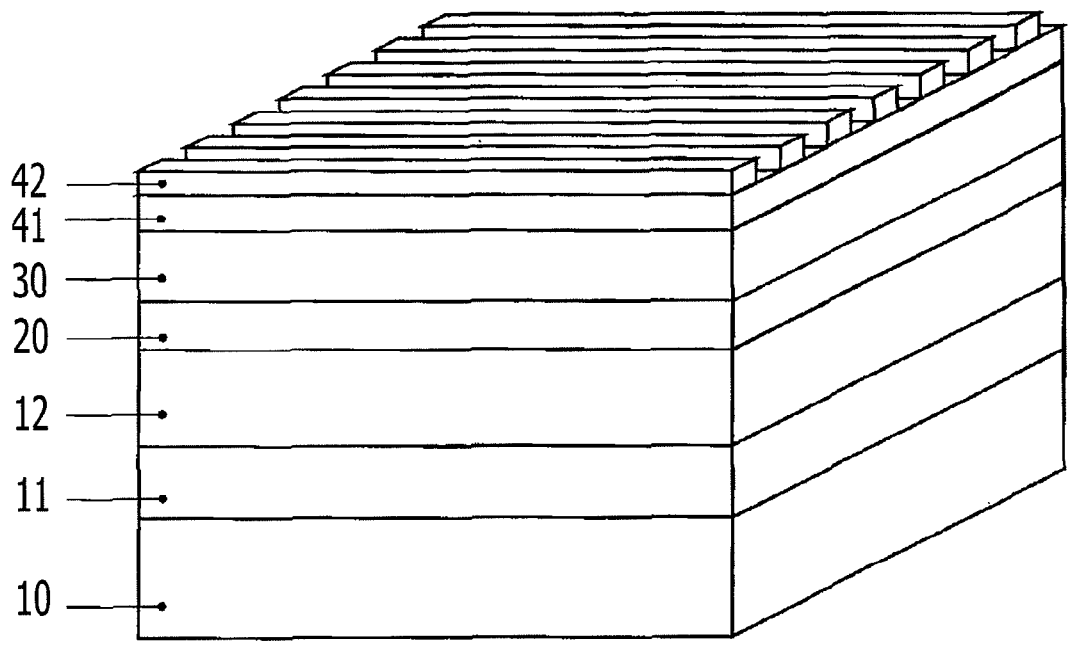
Figure 2D:
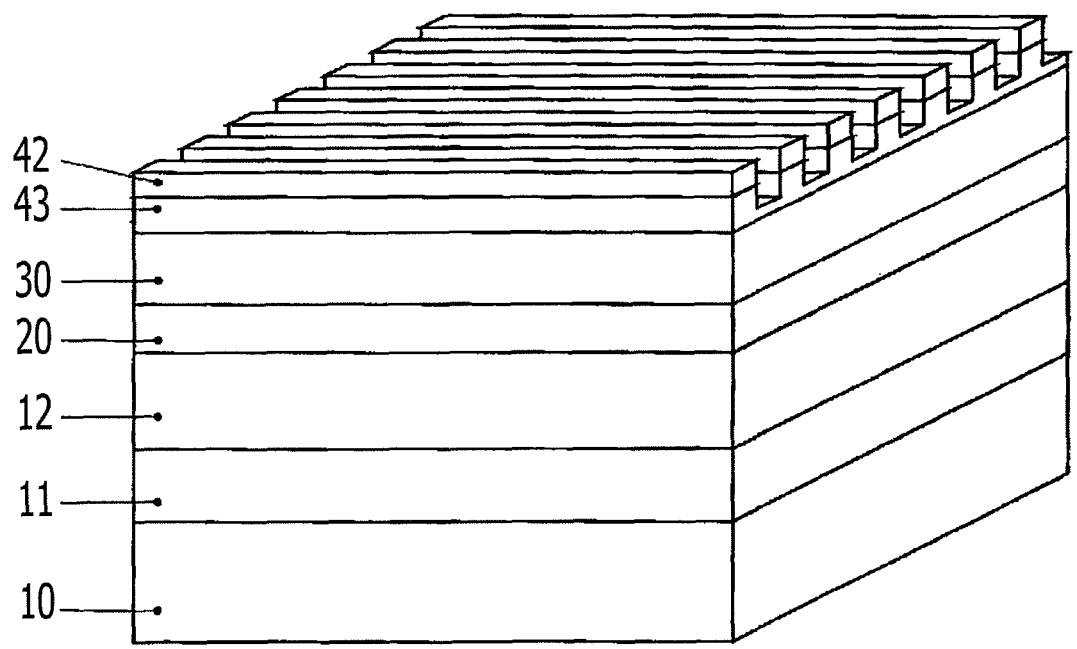
Figure 2E:
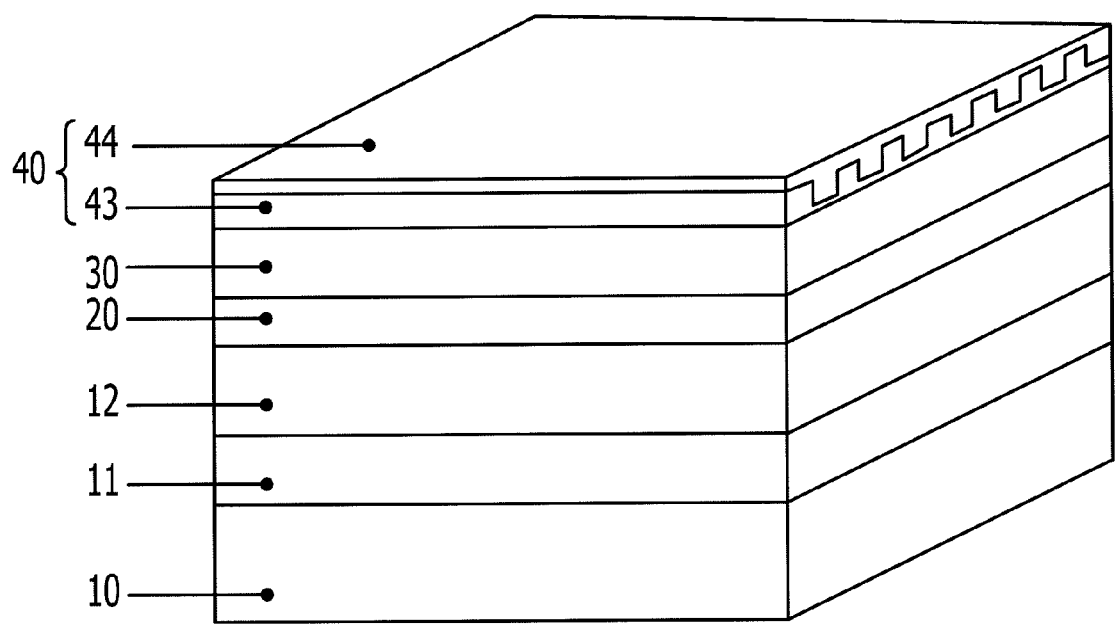

As illustrated in FIGS. 2C to 2E, a grating layer 40 of the second conductivity type including a base layer 43 and a cover layer 44 is stacked on the second cladding layer 30 of the second conductivity type.

As illustrated in FIG. 2C, a p-type GaAs film 41 is epitaxially grown on the p-type $Al_{0.26}Ga_{0.74}As$ cladding layer 30. The p-type GaAs film 41 with a thickness of about 40 nm is formed by MOCVD. TEGa and $AsH_3$ are used as source gases, and DEZn is used as a p-type impurity gas. The growth temperature is set at 640° C. A resist film, for example, a commercially available resist film for electron beam exposure or resist film for interference exposure, is formed on the p-type GaAs film 41. By an electron beam (EB) exposure technique or an interference exposure technique, a grating stripe pattern with a period of about 155.6 nm is projected to the resist film and exposure is performed. The resist film at exposed portions is removed, and a patterned resist layer 42 is formed. Using the patterned resist layer 42 as a mask, a p-type GaAs film 41 having a diffraction grating structure is formed by etching.

As illustrated in FIG. 2D, the p-type GaAs film is formed into a diffraction grating structure, and thereby, a grating base layer 43 is formed. A diffraction grating having grating grooves, for example, with a depth d of about 25 nm is formed by wet etching. As an etchant, for example, a mixed solution of aqueous ammonia, aqueous hydrogen peroxide, and water may be used. The patterned resist layer 42 is removed. In the wet etching, by adjusting the time of immersion in the etchant, the depth of grating grooves may be controlled.

As illustrated in FIG. 2E, a p-type $Al_{0.26}Ga_{0.74}As$ cover layer 44 is epitaxially grown on the p-type GaAs base layer 43 having a periodic projection-recess structure. The p-type $Al_{0.26}Ga_{0.74}As$ cover layer 44 with a thickness of about 50 nm is formed by MOCVD, the thickness being measured from the recessed portion of the base layer 43. TEGa, TMAl, and $AsH_3$ are used as source gases, and DEZn is used as a p-type impurity gas. The growth temperature is set at 640° C. By adjusting the flow ratio of the source gases, the Al compositional ratio of the cover layer 44 may be controlled. Thereby, a grating layer 40 including the p-type GaAs base layer 43 and the p-type $Al_{0.26}Ga_{0.74}As$ cover layer 44 is formed.

Figure 2F:
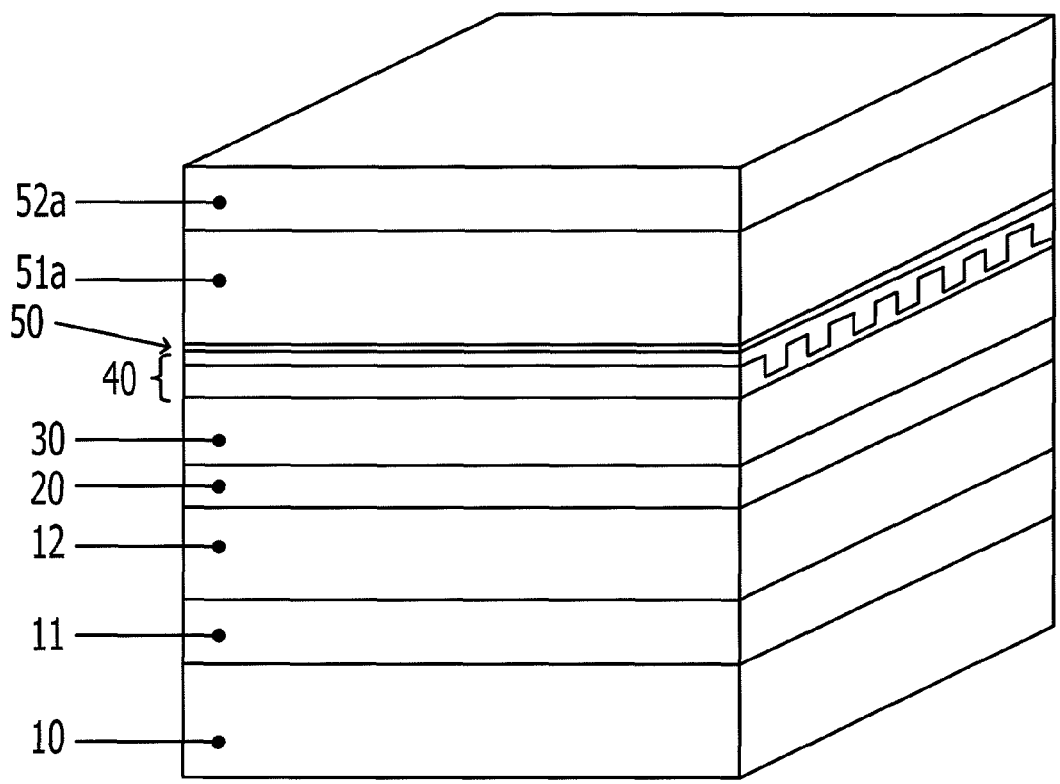
Figure 2G:
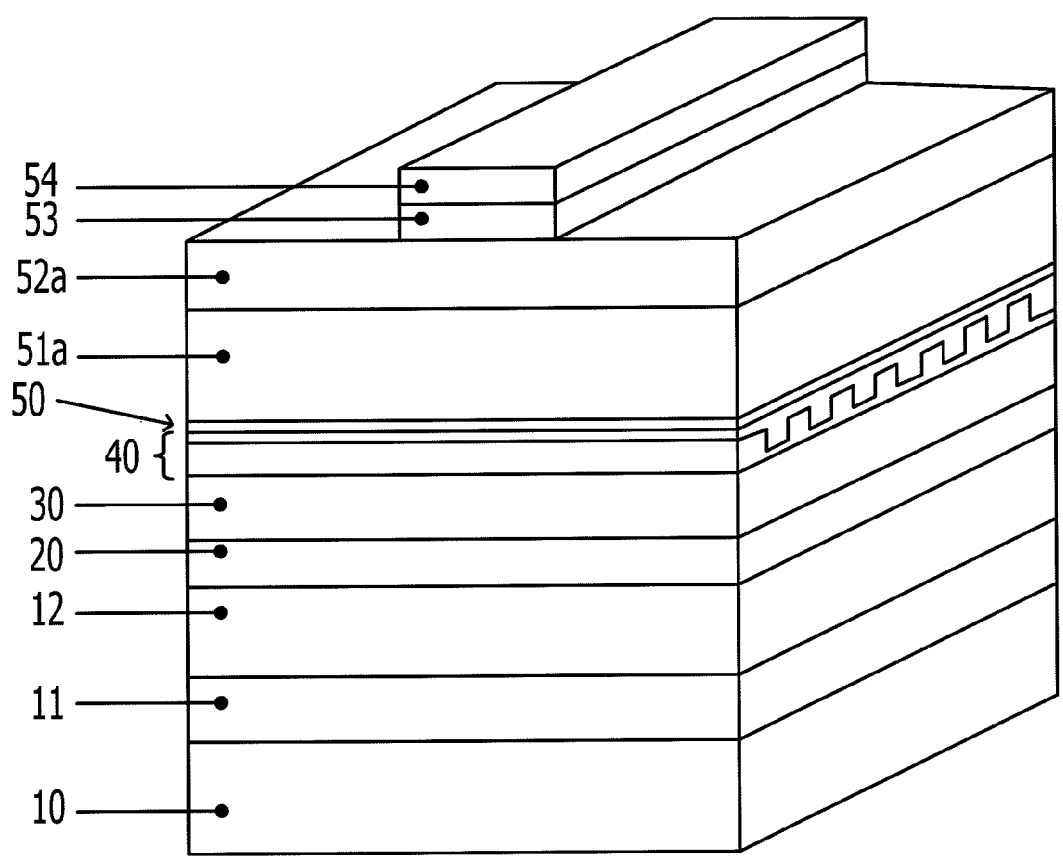
Figure 2H:
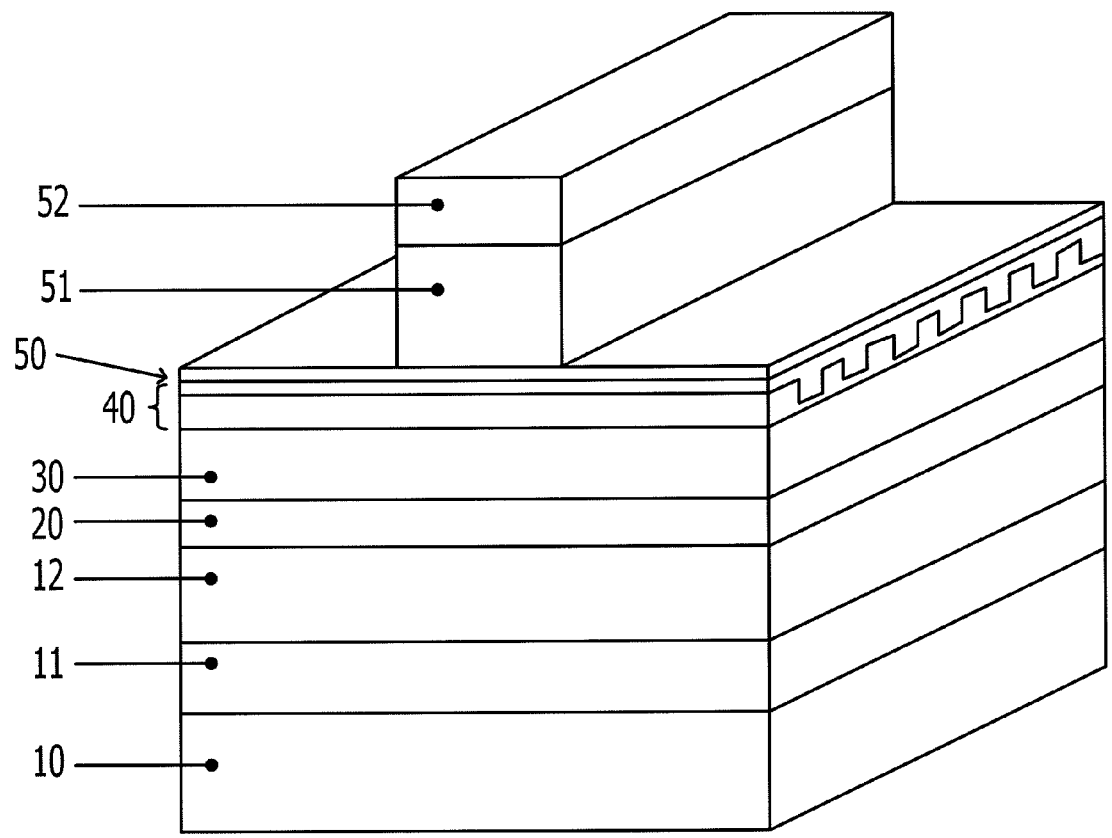

As illustrated in FIGS. 2F to 2H, an etch stop layer 50, and a third cladding layer 51 of the second conductivity type and a contact layer 52, which have a ridge structure, are stacked in that order on the grating layer 40.

As illustrated in FIG. 2F, a p-type $In_{0.48}Ga_{0.52}P$ (indium gallium phosphide) etch stop layer 50 is epitaxially grown on the grating layer 40. The p-type $In_{0.48}Ga_{0.52}P$ etch stop layer 50 with a thickness of about 10 nm is formed by MOCVD. TEGa, TMIn, and phosphine ($PH_3$) are used as source gases, and DEZn is used as a p-type impurity gas. The growth temperature is set at about 640° C. A p-type $Al_{0.35}Ge_{0.65}As$ cladding layer 51a is epitaxially grown on the p-type InGaP etch stop layer 50. The p-type $Al_{0.35}Ga_{0.65}As$ cladding layer 51a with a thickness of about 1,000 nm is formed by MOCVD. TEGa, TMAl, and $AsH_3$ are used as source gases, and DEZn is used as a p-type impurity gas. The growth temperature is set at about 640° C. A p-type GaAs contact layer 52a is epitaxially grown on the p-type $Al_{0.35}Ga_{0.65}As$ cladding layer 51a. The p-type GaAs contact layer 52a with a thickness of about 300 nm is formed by MOCVD. TEGa and $AsH_3$ are used as source gases, and DEZn is used as a p-type impurity gas. The growth temperature is set at about 550° C.

As illustrated in FIG. 2G, silicon dioxide ($SiO_2$) film and a resist film are stacked in that order on the p-type GaAs contact layer 52a. The resist film is subjected to exposure and development operations to form a patterned resist layer 54 extending in the resonator length direction with a width W of about 1.5 μm. Using the patterned resist layer 54 as a mask, the $SiO_2$ film is removed, for example, with a buffered hydrofluoric acid solution to form a patterned $SiO_2$ layer 53.

As illustrated in FIG. 2H, a p-type $Al_{0.35}Ga_{0.65}As$ cladding layer 51 and a p-type GaAs contact layer 52, which have a ridge structure, are formed, for example, by wet etching using the patterned $SiO_2$ layer 53 and resist layer 54 as a mask. As an etchant, for example, a mixed solution of aqueous ammonia, aqueous hydrogen peroxide, and water may be used. Since the etch stop layer 50 is not etched by the etchant, layers under than the etch stop layer 50 may not be etched. The patterned $SiO_2$ layer 53 and resist layer 54 are removed, thereby obtaining a ridge structure.

Figure 2I:
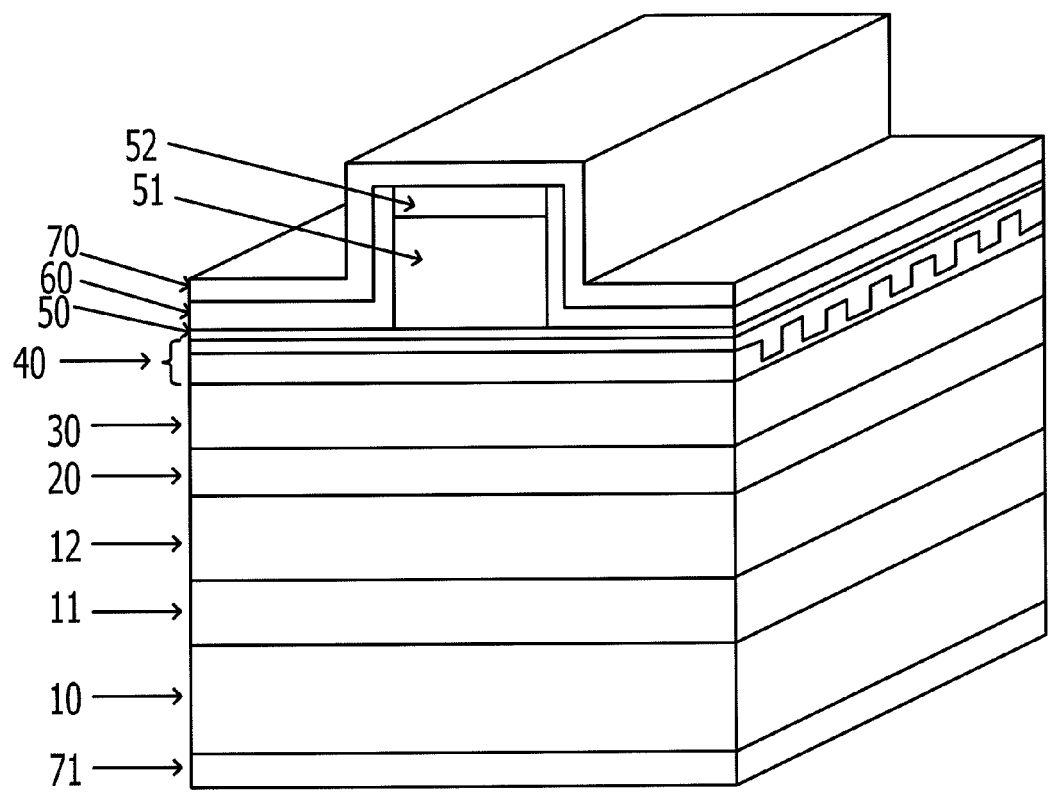

As illustrated in FIG. 2I, a protective film 60 is formed so as to cover the sidewalls of the third cladding layer 51 and the contact layer 52 and the etch stop layer 50, and an upper electrode 70 and a lower electrode 71 are formed. $SiO_2$ is deposited so as to cover the ridge structure. $SiO_2$ on the upper surface of the p-type GaAs contact layer 52 is selectively removed, for example, with a buffered hydrofluoric acid solution, to form a $SiO_2$ protective film 60. An upper electrode 70 having a Ti (titanium)-Pt (platinum)-Au (gold) layered structure is formed on the $SiO_2$ protective film 60, for example, by electron beam evaporation or the like. The n-type GaAs substrate 10 is ground so as to have a thickness of about 150 μm. A lower electrode 71 having an AuGe (gold-germanium alloy)-Au layered structure is formed, for example, by electron beam evaporation or the like. Both end faces of the element are cleaved such that the resonator length L becomes 600 μm. One of the cleaved end faces is subjected to antireflection coating with a reflectance of 1% or less, and the other cleaved end face is coated with a reflection film with a reflectance of 94%. A DFB laser element is formed as a reference sample.

The refractive index difference in the grating layer 40 of the reference sample is evaluated. The refractive index difference in the reference sample may be about 0.013. The grating layer 40 of the reference sample may include a base layer 43 having GaAs and a cover layer 44 having $Al_{0.26}Ga_{0.74}As$.

The theoretical value of the refractive index difference between GaAs and $Al_{0.26}Ga_{0.74}As$ may be about 0.155. The refractive index difference in the reference sample may be smaller than the theoretical value.

Figure 3A:
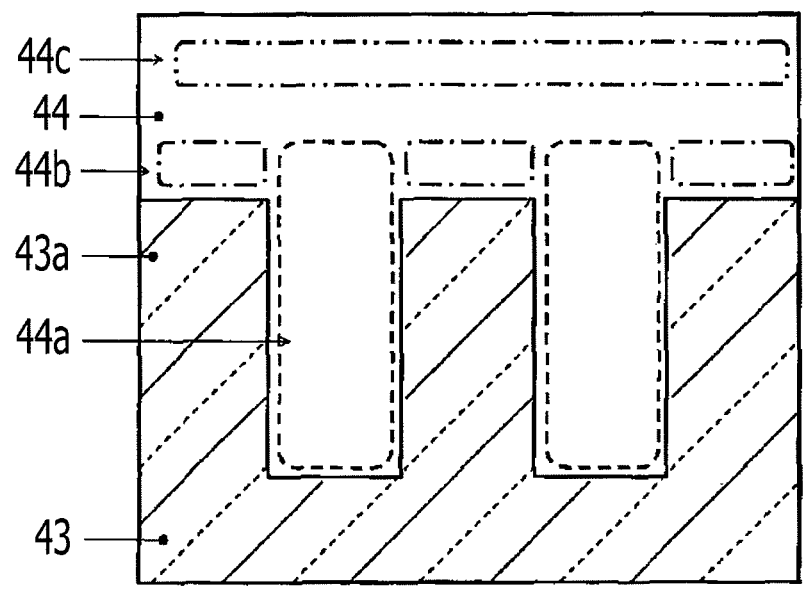
FIGS. 3A and 3B illustrate an exemplary grating layer.
Figure 3B:
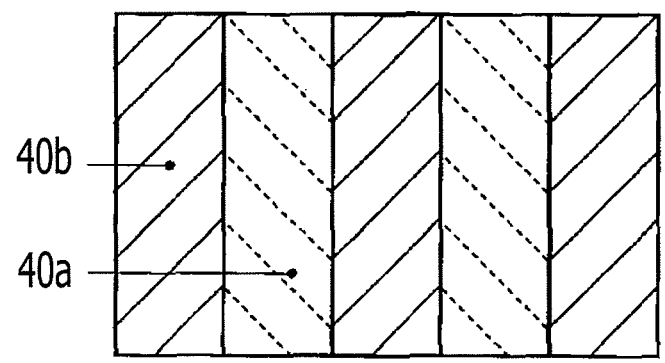

FIGS. 3A and 3B illustrate an exemplary grating layer. FIGS. 3A and 3B each are an enlarged cross-sectional view of a grating layer, and may be a model diagram of an optically equivalent diffraction grating. The composition distribution of Al in the grating layer is evaluated by a transmission electron microscope and energy-dispersive X-ray spectrometry. In a cover layer 44a formed above recessed portions of a base layer 43, for example, regions surrounded by the broken line in FIG. 3A, the Al compositional ratio is lower than $Al_{0.26}Ga_{0.74}As$ and may be about $Al_{0.20}Ga_{0.80}As$. In a cover layer 44b formed above projecting portions of the base layer 43, for example, regions surrounded by the one-dot chain line in FIG. 3A, the Al compositional ratio is higher than $Al_{0.26}Ga_{0.74}As$ and may be about $Al_{0.35}Ga_{0.65}As$. In a cover layer 44c which is formed after the surface is planarized, for example, an upper-layer region of the cover layer 44 surrounded by the two-dot chain line in FIG. 3A, the composition may be $Al_{0.26}Ga_{0.74}As$. When the cover layer 44 is epitaxially grown so as to fill the base layer 43 having a projection-recess structure, because of the difference in the growth rate between the projecting portions and the recessed portions of the base layer 43, the Al compositional ratio in the cover layer 44 may vary depending on the position.

The refractive index of the cover layer 44a located above the recessed portions of the base layer 43 is set at n1. The refractive index of the cover layer 44b located above the projecting portions of the base layer 43 is set at n2. The refractive index of the base layer 43 is set at n3. The depth d of the grating formed in the base layer 43 may be about 25 nm, and the period p may be about 155.6 nm. The depth d and the period p of the grating formed in the base layer 43 may be smaller than the spread of emission wave function in the active layer 20. The grating layer 40 may be optically substantially equal to a diffraction grating including regions 40a having the refractive index n1 and regions 40b having an average refractive index n4 of the refractive index n2 and the refractive index n3 as illustrated in FIG. 3B. The average refractive index n4 may be a weighted average refractive index of the refractive index n2 of the cover layer 44b having a certain thickness and the refractive index n3 of the projecting portions 43a of the base layer having the depth d. In order to increase the refractive index difference in the grating layer 40, the effective refractive index difference Δne between n1 and n4 may be large. For example, the refractive indices of the individual regions may have the relationships n1>n2 and n1>n3, or n1>n2≥n3.

The Al compositional ratio distribution in the cover layer 44a may be about 20% ($Al_{0.20}Ga_{0.80}As$) in average. The Al compositional ratio distribution in the cover layer 44b may be about 35% ($Al_{0.35}Ga_{0.65}As$) in average. The Al compositional ratio in the base layer 43 of the reference sample may be substantially 0% (GaAs). The Al compositional ratio of AlGaAs has a negative correlation with its own refractive index, and therefore, the refractive indices of the individual regions of the reference sample may have the relationship n3>n1>n2. In the reference sample, since the average refractive index n4 of n2 and n3 is averaged such that the effective refractive index difference Δne between the average refractive index n4 and the refractive index n1 decreases, the refractive index difference in the grating layer 40 may be decreased as compared with the theoretical value.

A DFB laser element is fabricated, in which n3 is set small and, for example, the Al compositional ratio in the base layer 43 is set large, and is evaluated. For example, a test sample is fabricated, in which the composition of the base layer 43 is $Al_{0.35}Ga_{0.65}As$, and is evaluated. In the fabrication of the test sample, in the operation of forming the base layer illustrated in 3A, MOCVD may be used in which TEGa, TMAl, and $AsH_3$ are used as source gases and GEZn is used as a p-type impurity gas. The Al compositional ratio of the base layer 43 may be controlled by adjusting the flow ratio of the source gases. The refractive index difference in the test sample may be about 0.081, which is improved from the refractive index difference (about 0.013) of the reference sample.

The Al compositional ratio distribution in the cover layer 44a may be about 20% ($Al_{0.20}Ga_{0.80}As$) in average, and the Al compositional ratio in the cover layer 44b may be about 35% ($Al_{0.35}Ga_{0.65}As$) in average. The Al compositional ratio in the base layer 43 of the test sample may be about 35% ($Al_{0.35}Ga_{0.65}As$). In the test sample, the refractive indices of the individual regions may have the relationship n1>n2=n3. In the test sample, since the average refractive index n4 of n2 and n3 is not averaged such that the effective refractive index difference Δne between the average refractive index n4 and the refractive index n1 decreases, the refractive index difference in the test sample may be improved as compared with the refractive index difference of the reference sample. Since n3 is set small and, for example, the Al compositional ratio in the base layer is set large, the effective refractive index difference may be improved.

When a reference sample includes a GaAs base layer and an $Al_{0.26}Ga_{0.74}As$ cover layer and a test sample includes an $Al_{0.35}Ga_{0.65}As$ base layer and an $Al_{0.26}Ga_{0.74}As$ cover layer, DFB laser elements including reference samples and test samples, in which the grating depth d is 15, 20, or 25 nm, are fabricated.

Figure 4:
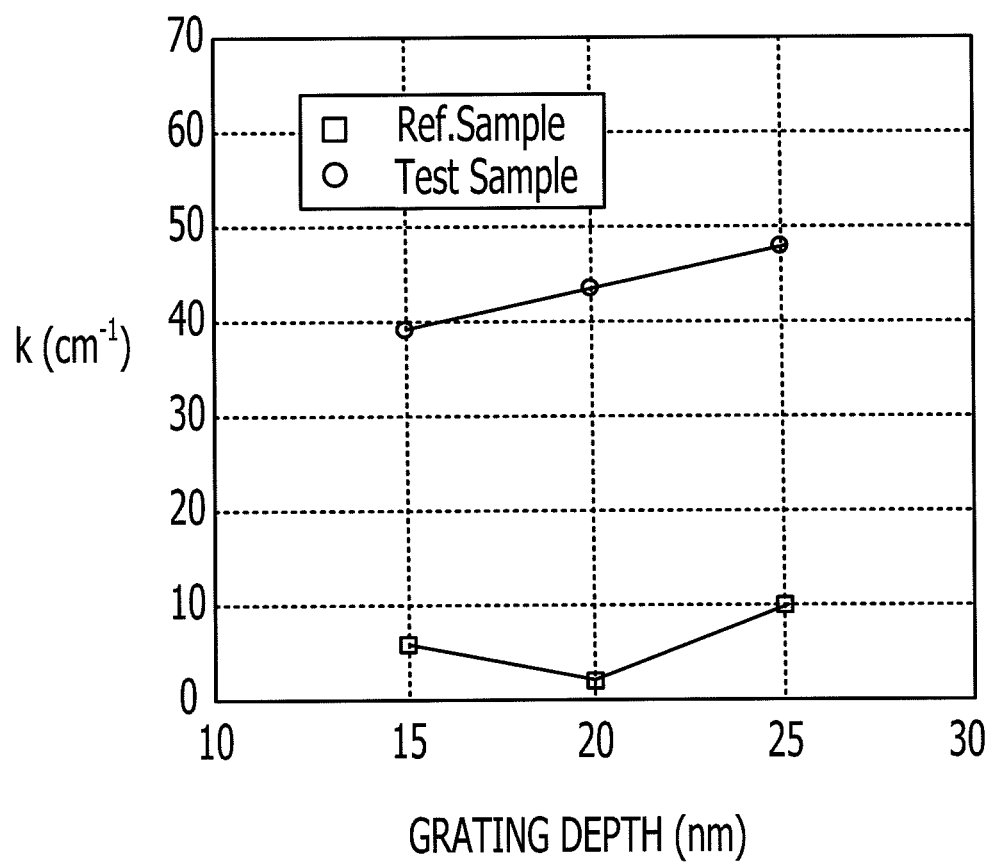
FIG. 4 illustrates an exemplary relationship between a coupling coefficient of a grating layer and a grating depth.

FIG. 4 illustrates an exemplary relationship between a coupling coefficient of a grating layer and a grating depth. FIG. 4 may illustrate dependence of the coupling coefficient κ of the grating layer on the grating depth d. In FIG. 4, the square dot denotes dependence of the coupling coefficient κ on the grating depth d in a reference sample. The circular dot denotes dependence of the coupling coefficient κ on the grating depth d in a test sample. The coupling coefficient κ in the test samples may be about four to five times larger than the coupling coefficient κ in the reference samples. In the test samples, the coupling coefficient κ is substantially proportional to the grating depth d. In the reference samples, the groove coupling coefficient κ may not correlate with the grating depth d. In the reference samples, even when the grating depth d increases, since the relationships among the refractive indices of the individual regions are inconsistent, for example, the relationship n3>n1>n2 is established, no effective refractive index difference may be caused.

DFB laser elements in which the effective refractive index difference of the grating layer is about 0.014, 0.040, 0.054, 0.067, or 0.081 are fabricated by changing the Al compositional ratio in the base layer or the cover layer.

Figure 5:
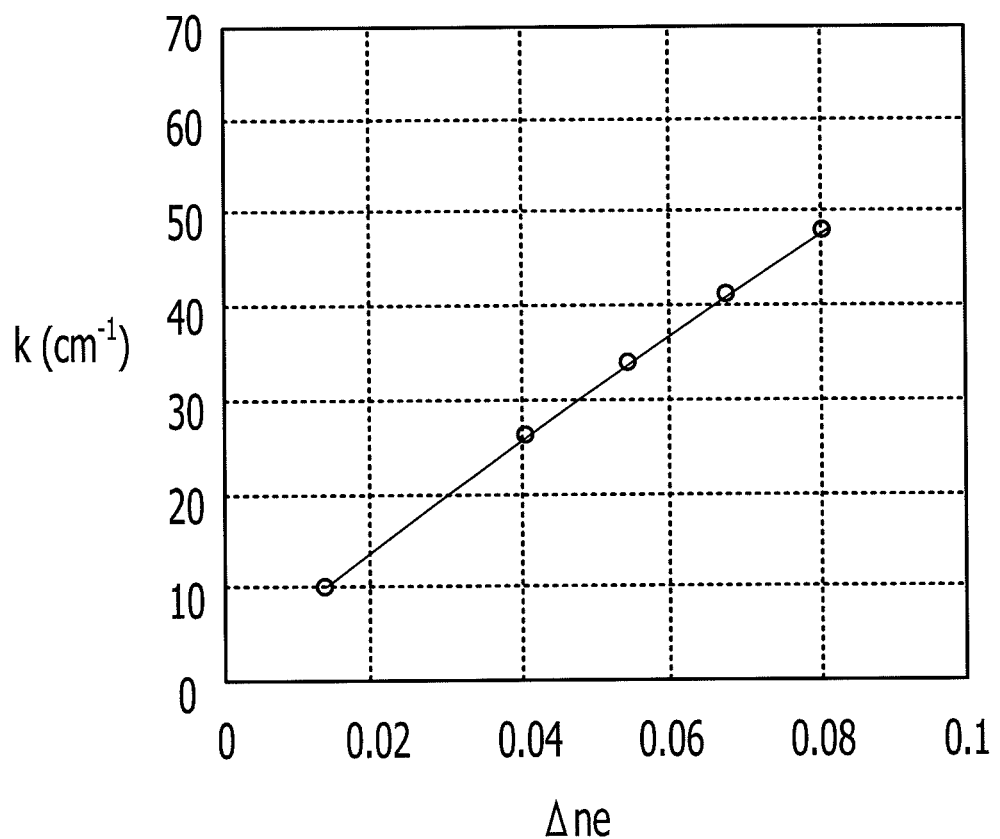
FIG. 5 illustrates an exemplary relationship between a coupling coefficient of a grating layer and an effective refractive index difference.

FIG. 5 illustrates an exemplary relationship between a coupling coefficient of a grating layer and a effective refractive index difference. FIG. 5 may illustrate dependence of the coupling coefficient κ of the grating layer on the effective refractive index difference Δne. The coupling coefficient κ of the grating layer may be substantially proportional to the effective refractive index difference Δne. The coupling coefficient κ of the grating layer may be 10 $cm^{-1}$ or more and, for example, 20 $cm^{-1}$ or more. The base layer and the cover layer may be designed such that the effective refractive index difference Δne in the grating layer is at least 0.02 or more, for example, 0.04 or more.

A grating layer includes a base layer and a cover layer which include AlGaAs. The cover layer is epitaxially grown so as to fill the base layer having a projection-recess structure. The growth rate above the projecting portion of the base layer may differ from the growth rate above the recessed portion of the base layer, and the cover layer may grow with different Al compositional ratios depending on the position. By designing the composition of the base layer such that the effective refractive index difference of the grating layer increases using the change in the refractive index with the change in the Al compositional ratio, the coupling coefficient of the grating layer may be improved. The base layer and the cover layer may include a group III-V compound semiconductor including three or more elements, such as InGaP or InGaAsP (indium gallium arsenide phosphide). By epitaxially growing a compound semiconductor so as to fill the projection-recess structure of the base layer, a cover layer in which the compound semiconductor compositional ratio and the refractive index vary depending on the position may be grown. By designing the composition of the base layer such that the effective refractive index difference in the grating layer is increased using the change in the compound semiconductor compositional ratio and the change in the refractive index in the cover layer, a DFB laser element including a grating layer with an improved coupling coefficient may be manufactured. The DFB laser element manufactured by the manufacturing method described above may have high laser output efficiency and reliability as well as a small size. When a DFB laser element is combined with an SHG element, a laser beam with a shorter wavelength may be emitted.

Figure 6:
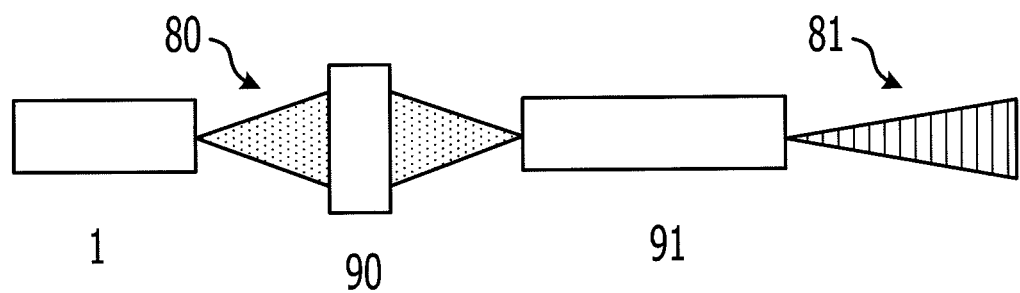
FIG. 6 illustrates an exemplary semiconductor laser.

FIG. 6 illustrates an exemplary semiconductor laser. The semiconductor laser illustrated in FIG. 6 may be a green semiconductor laser operating in a wavelength range around 530 nm including an infrared DFB laser element operating in a wavelength range around 1,060 nm. The semiconductor laser includes a DFB laser element, which is the test sample, and an SHG element, such as a periodically poled lithium niobate ($LiNbO_3$) crystal, arranged on the optical path of a laser beam emitted from the DFB laser element. For example, a current is injected into a DFB laser element 1, and an emitted infrared laser beam 80 in a wavelength range around 1,060 nm is incident on an SHG element 91 through an optical system 90, such as a condenser lens. A green laser beam 81 in a wavelength range around 530 nm is emitted from the SHG element 91. For example, a projector or the like which includes a green semiconductor laser and red and blue semiconductor lasers may be provided.

MOCVD is used to epitaxially grow layers of a DFB laser element. Alternatively, molecular beam epitaxy or the like may be used. Although an n-type GaAs substrate is used as a semiconductor substrate, a p-type GaAs substrate may be used, or an InP substrate may be used. The wavelength of a laser beam emitted may be in a range around 980 nm or around 1,300 nm. A laser beam having a desired wavelength may be obtained by adjusting the structure of the active layer and the period of the projection-recess structure of the grating layer.

Figure 7A:
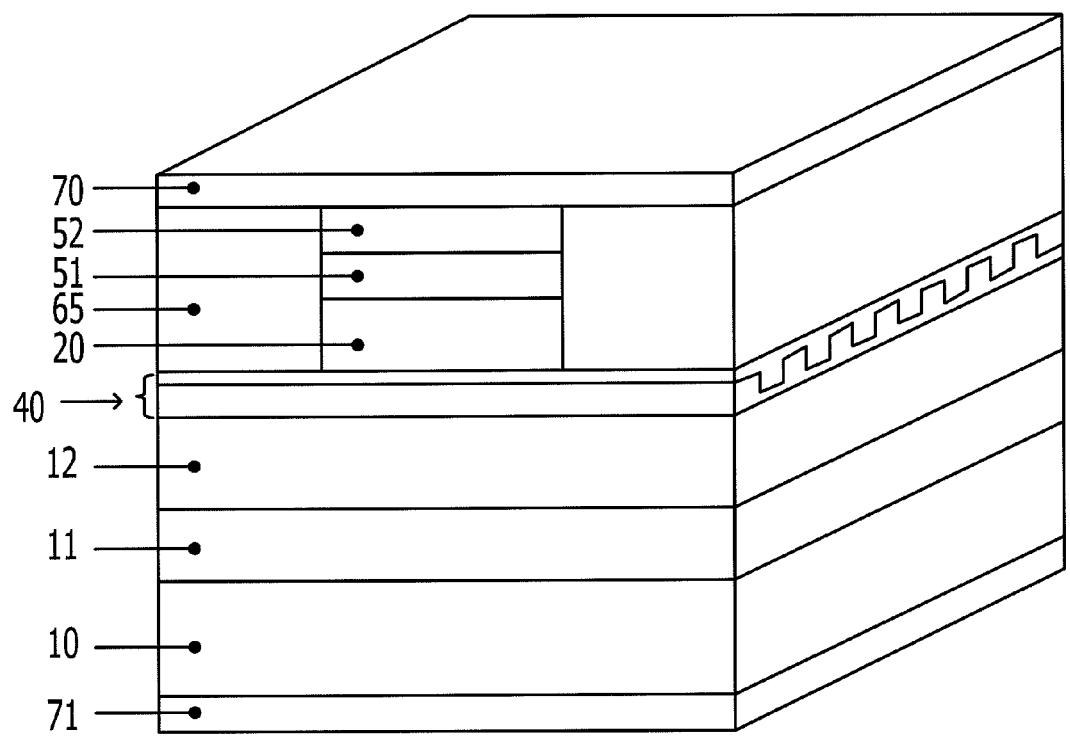
FIGS. 7A to 7C each illustrate an exemplary semiconductor element.
Figure 7B:
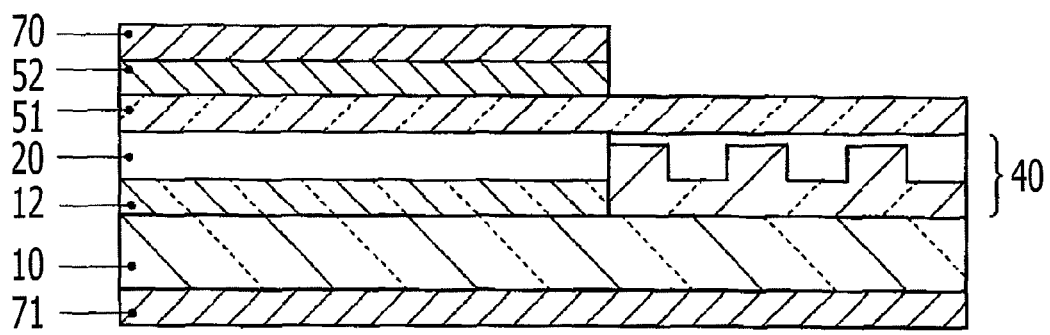
Figure 7C:
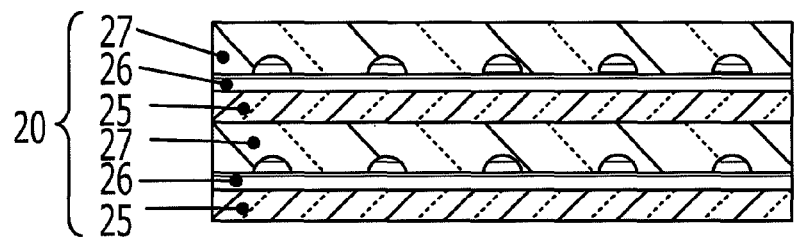

FIG. 7A to FIG. 7C each illustrate an exemplary semiconductor element. FIG. 7A is a perspective view of a semiconductor element. FIG. 7B is a side view of a semiconductor element. FIG. 7C is an enlarged side view of an active layer of a semiconductor element. An optical semiconductor element may include a mesa structure containing an embedded layer 65 as illustrated in FIG. 7A. A grating layer 40 may be disposed in contact with an active layer 20 on the substrate 10 side. As illustrated in FIG. 7B, a grating layer 40 may be disposed in contact with and in series beam propagation axis) with an active layer 20 along a cavity axis or a beam propagation axis, and the semiconductor element may be used as a DBR laser element. As illustrated in FIG. 7C, an active layer 20 may be a quantum dot active layer including a barrier layer 25, quantum dots 26, and a barrier layer 27. For example, in order to obtain a laser beam in a wavelength range around 1,300 nm, a quantum dot active layer 20 may include a non-doped GaAs barrier layer 25 with a thickness of about 5 nm, InAs quantum dots 26 with a height of about 5 nm obtained by growing a non-doped InAs (indium arsenide) layer to several atomic layer thick, and a non-doped GaAs barrier layer 27 with a thickness of about 35 nm that covers and caps the InAs quantum dots 26. The grating period of the grating layer may be about 190 nm.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical semiconductor element comprising:
a grating base layer including a projection-recess structure disposed over a substrate; and
a grating cover layer including a group III-V semiconductor having three or more elements,
wherein the grating cover layer includes a first region which is disposed over recessed portions of the grating base layer and which has a first compositional ratio of aluminum in a group III-V semiconductor having a first refractive index, and a second region which is disposed over projecting portions of the grating base layer and which has a second compositional ratio of aluminum in a group III-V semiconductor having a second refractive index that is smaller than the first refractive index,
wherein the grating base layer includes a third compositional ratio of aluminum in a group III-V semiconductor having a third refractive index that is smaller than the first refractive index,
wherein the third compositional ratio is larger than the first compositional ratio.

2. The optical semiconductor element according to claim 1, wherein the third refractive index is smaller than the second refractive index.

3. The optical semiconductor element according to claim 1, wherein the difference between the first refractive index and the weighted average refractive index of the second refractive index and the third refractive index is 0.02 or more.

4. The optical semiconductor element according to claim 1, wherein the grating base layer and the grating cover layer include AlGaAs.

5. The optical semiconductor element according to claim 1, further comprising, an active layer disposed below the grating base layer.

6. The optical semiconductor element according to claim 5, wherein the active layer includes a multiquantum well structure including a well layer having InGaAs and a barrier layer having GaAs.

7. The optical semiconductor element according to claim 1, further comprising, an active layer disposed in series with the grating base layer and the grating cover layer.

8. The optical semiconductor element according to claim 1, wherein the second compositional ratio is larger than the first compositional ratio.

* * * * *